(12) United States Patent
Liu et al.

(10) Patent No.: US 11,828,815 B2
(45) Date of Patent: Nov. 28, 2023

(54) AC/DC LEAKAGE DETECTION METHOD

(71) Applicant: QINGDAO TOPSCOMM COMMUNICATION CO., LTD, Shandong (CN)

(72) Inventors: Zhen Liu, Shandong (CN); Jianhua Wang, Shandong (CN)

(73) Assignee: QINGDAO TOPSCOMM COMMUNICATION CO., LTD, Shandong (CN)

( * ) Notice: Subject to any disclaimer, the term of this patent is extended or adjusted under 35 U.S.C. 154(b) by 0 days.

(21) Appl. No.: 17/767,459

(22) PCT Filed: Sep. 30, 2020

(86) PCT No.: PCT/CN2020/119337
§ 371 (c)(1),
(2) Date: Apr. 8, 2022

(87) PCT Pub. No.: WO2021/068836
PCT Pub. Date: Apr. 15, 2021

(65) Prior Publication Data
US 2022/0413062 A1    Dec. 29, 2022

(30) Foreign Application Priority Data

Oct. 9, 2019   (CN) .......................... 201910954739.9

(51) Int. Cl.
*G01R 31/52* (2020.01)
*G01R 15/18* (2006.01)
*G01R 19/165* (2006.01)

(52) U.S. Cl.
CPC ............. *G01R 31/52* (2020.01); *G01R 15/18* (2013.01); *G01R 19/16571* (2013.01)

(58) Field of Classification Search
CPC ... G01R 31/52; G01R 15/18; G01R 19/16571
See application file for complete search history.

(56) References Cited

U.S. PATENT DOCUMENTS 8,315,023 B2 * 11/2012 Meisel ................... H02H 3/332
361/42
11,163,014 B2 * 11/2021 Wakimoto ............. G01R 31/50
(Continued)

FOREIGN PATENT DOCUMENTS

CN        107979066 A     5/2018
CN        109932558 A     6/2019
(Continued)

OTHER PUBLICATIONS

International Search Report for PCT/CN2020/119337 dated Jan. 5, 2021, ISA/CN.

*Primary Examiner* — Patrick Assouad
*Assistant Examiner* — Demetrius R Pretlow
(74) *Attorney, Agent, or Firm* — Yue (Robert) Xu; Apex Attorneys at Law, LLP

(57) ABSTRACT

An AC/DC leakage detection method, which supports the detection of DC leakage and AC leakage. A DC leakage current and a low-frequency leakage current are measured by means of magnetic modulation technology, an AC signal is measured in the form of pure induction, and two detection modes are performed in a time-sharing manner. A collected leakage signal is converted into a digital signal through an AD converter. By means of the method of the present invention, the processing of a leakage signal is divided into three channels for respectively processing DC leakage, low-frequency AC leakage, and high-frequency AC leakage. The overall effective value of residual current is calculated by integrating results of DC detection and AC detection. The method of the present invention supports the detection of a suddenly increased current; and when there is a suddenly increased current, detection mode switching is performed by detecting the current sudden change of the current.

8 Claims, 6 Drawing Sheets

(56) References Cited

U.S. PATENT DOCUMENTS

| | | |
|---|---|---|
| 2003/0173922 A1 | 9/2003 | Pelonis |
| 2005/0146335 A1* | 7/2005 | Wild .................... G01R 31/52 |
| | | 324/510 |
| 2005/0212505 A1* | 9/2005 | Murray ............ G01R 19/16547 |
| | | 324/126 |
| 2014/0159704 A1* | 6/2014 | Rathsmann .......... G01R 15/183 |
| | | 324/117 R |
| 2014/0361765 A1* | 12/2014 | Hackl ...................... H02H 3/33 |
| | | 324/244 |
| 2017/0016959 A1* | 1/2017 | Mizoguchi ............. G01R 31/44 |
| 2017/0131339 A1* | 5/2017 | Inamoto ................. G01R 31/40 |
| 2017/0350927 A1* | 12/2017 | Gabrielsson .......... B60L 3/0069 |
| 2019/0331725 A1* | 10/2019 | Ikushima ......... G01R 19/16538 |

FOREIGN PATENT DOCUMENTS

| | | |
|---|---|---|
| CN | 110190581 A | 8/2019 |
| CN | 110672913 A | 1/2020 |
| JP | 3783173 B2 * | 6/2006 |
| KR | 20180033892 A * | 4/2018 |

\* cited by examiner

AC/DC LEAKAGE DETECTION METHOD

CROSS REFERENCE OF RELATED APPLICATION

The present application is the national phase application of International Patent Application No. PCT/CN2020/119337, titled "AC/DC LEAKAGE DETECTION METHOD", filed on Sep. 30, 2020, which claims priority to Chinese Patent Application No. 201910954739.9, titled "COMPLEX WAVEFORM SIGNAL PROCESSING METHOD FOR DETECTING AC/DC LEAKAGE CURRENT", filed on Oct. 9, 2019 with the China National Intellectual Property Administration, both of which are incorporated herein by reference in their entireties.

FIELD

The present disclosure relates to the field of AC/DC leakage current detection, and in particular, to a method for detecting an AC/DC leakage current.

BACKGROUND

With the development of economy, the power industry develops rapidly, and a scale of various household appliances is also increasing day by day. It is particularly important to ensure the safety of electricity consumption of a household. In a current power environment, a residual current includes a low-frequency AC, a high-frequency AC and a DC signal, among which the AC residual current is very harmful to people, and ventricular fibrillation will occur when the AC residual current reaches 50 mA/s. At present, with an increase in types of the electricity consumption, DC power is widely used in a DC charging pile, a variable frequency motor, certain types of home notebooks, a microwave oven, and a washing machine, etc., thus, a problem of DC residual current detection has also become more important. There are many reasons for DC leakage, for example, insulation material of a secondary circuit is unqualified, in disrepair or seriously aged, an equipment is damaged and defective, and the secondary circuit and the equipment are damp and water enters. In conventional technology, domestic leakage protectors are mainly AC-type leakage protectors, which can only detect an AC leakage current, but cannot detect a DC leakage current. In addition, the AC-type leakage protector does not cover the detection of a high-frequency leakage current. Therefore, the leakage protector in the conventional technology has shortcomings in safety protection.

SUMMARY

A method for detecting an AC/DC leakage current is provided according to the present disclosure, to effectively detect an AC/DC leakage current, and is applied to a magnetic core with any one material.

To achieve the above objective, in the present disclosure, an H-bridge driving module is used to excite a magnetic core. The method includes: detecting a DC current and a low-frequency AC current in a case that a positive level and a negative level are outputted by the H-bridge, where bidirectional excitation is applied to a magnetic core to make the magnetic core enter a saturation region; and detecting, in a case that a low level is outputted, an AC current in the pure induction mode. A sampled signal is amplified and converted into a digital signal through AD. For signal processing, processing of the sampled signal includes a DC current detection channel, a low-frequency current detection channel and a high-frequency current detection channel.

In a DC detection mode, a processing method includes the following steps:
step 1: adopting a square wave for synchronization, to distinguish a response signal when the magnetic core is positively excited from a response signal when the magnetic core is negatively excited;
step 2: extracting effective data in a detection signal corresponding to a rising edge and effective data in the detection signal corresponding to a falling edge;
step 3: calculating a mean of the effective data corresponding to the rising edge, and calculating a mean of the effective data corresponding to the falling edge;
step 4: subtracting the mean of the effective data corresponding to the falling edge from the mean of the effective data corresponding to the rising edge to acquire a demodulation value;
step 5: comparing the demodulation value y, with a threshold, and counting a comparison result;
step 6: windowing on a demodulated sequence;
step 7: calculating a DC current corresponding to the demodulated sequence in the window;
step 8: calculating an AC current at a frequency of 50 Hz corresponding to the demodulated sequence in the window; and
step 9: correcting the AC current at the frequency of 50 Hz and the DC current.

In a low-frequency AC detection mode, a processing method includes the following steps:
step 1: passing by an AD sampled signal through a low-pass filter;
step 2: performing down sampling on the AD sampled signal;
step 3: comparing a voltage of the down sampled signal with a threshold Thr1 set by software and counting a comparison result; and generating, in a case that a count is greater than a value for a time period, an interrupt signal is generated by hardware to a CPU;
step 4: windowing and analyzing the down sampled data sequence in the window;
step 5: performing FFT analysis on data in the window; and
step 6: correcting an amplitude of a signal at each frequency point, to acquire a leakage current at each frequency point.

In a high-frequency detection channel, a processing method includes the following steps:
step 1: passing by an AD sampled signal through a band-pass filter;
step 2: windowing sampled data; and setting the number of points of the sampled data after windowing be consistent with the number of points of the low-frequency signal after windowing in order to multiplex low-frequency FFT; and
step 3: performing FFT analysis on data in the window, where a frequency of 20.5 kHz to 150 kHz is used in a FFT channel for subsequent processing.

According to the method of the present disclosure, the DC leakage current and the AC leakage current can be detected. The DC leakage current and the low-frequency leakage current are detected by magnetic modulation technology, and the AC signal is detected by pure induction. Time-sharing (Time Division Multiplexing) detection is performed on the DC current and the AC current. An acquired leakage signal is converted into a digital signal through an AD converter. In the method according to the present disclosure, a leakage signal is processed by three channels, including a DC leakage current channel, a low-frequency AC leakage current channel and a high-frequency AC leakage current channel. Based on results of the DC detection and AC detection, an overall effective value of residual current is calculated. In the method according to the present disclosure, a sudden increase of the current can be detected. When the current suddenly increases, the detection mode is switched by detecting the sudden change of the current.

DETAILED DESCRIPTION

Figure 1:
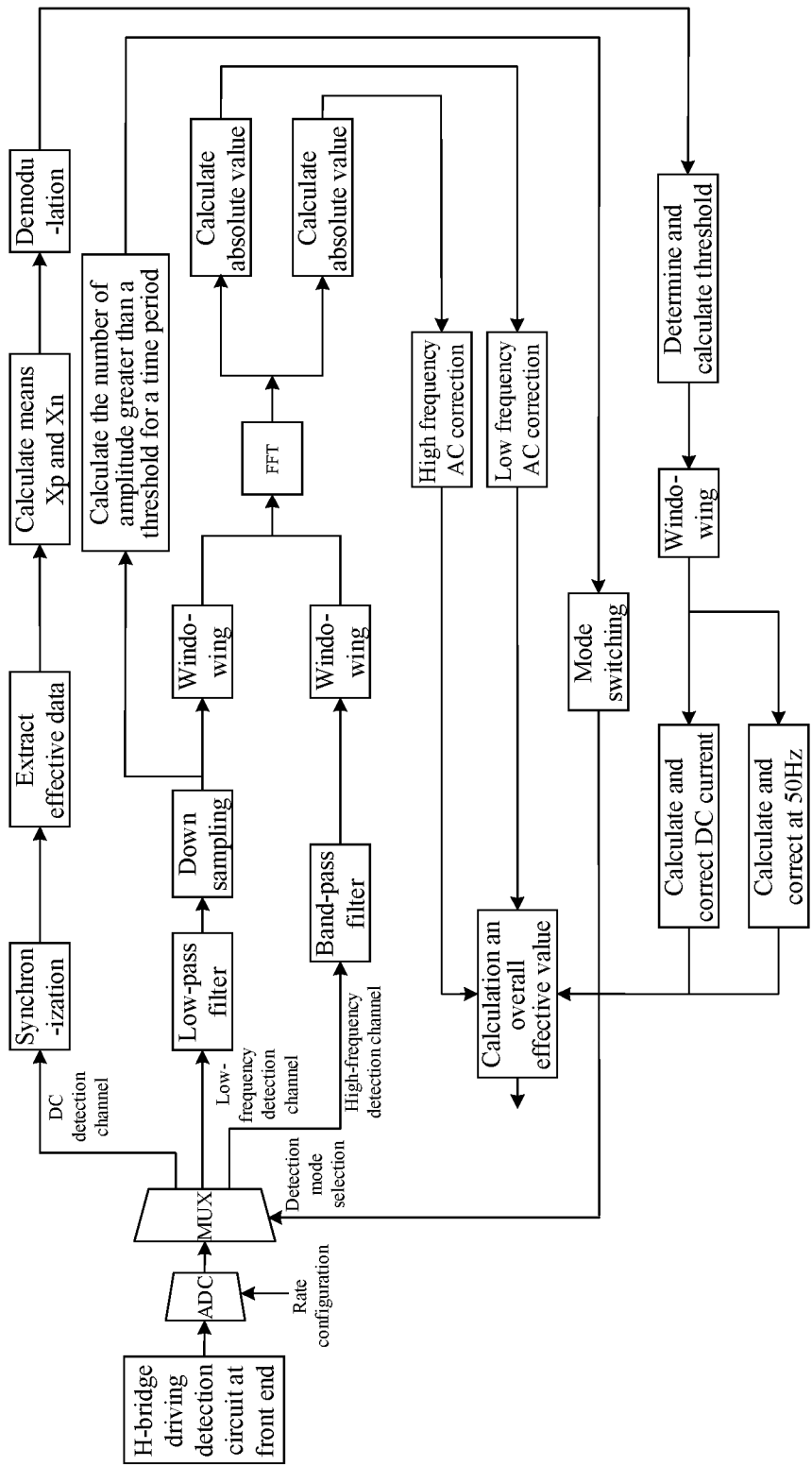
FIG. 1 is a block diagram of an algorithm for detecting an AC/DC leakage current according to the present disclosure.

A solution for detecting an AC/DC leakage current and a signal processing method according to the present disclosure are described below in combination with a solution of an H-bridge driving circuit in FIG. 2 and a block diagram of an algorithm for detecting an AC/DC leakage current in FIG. 1.

Figure 2:
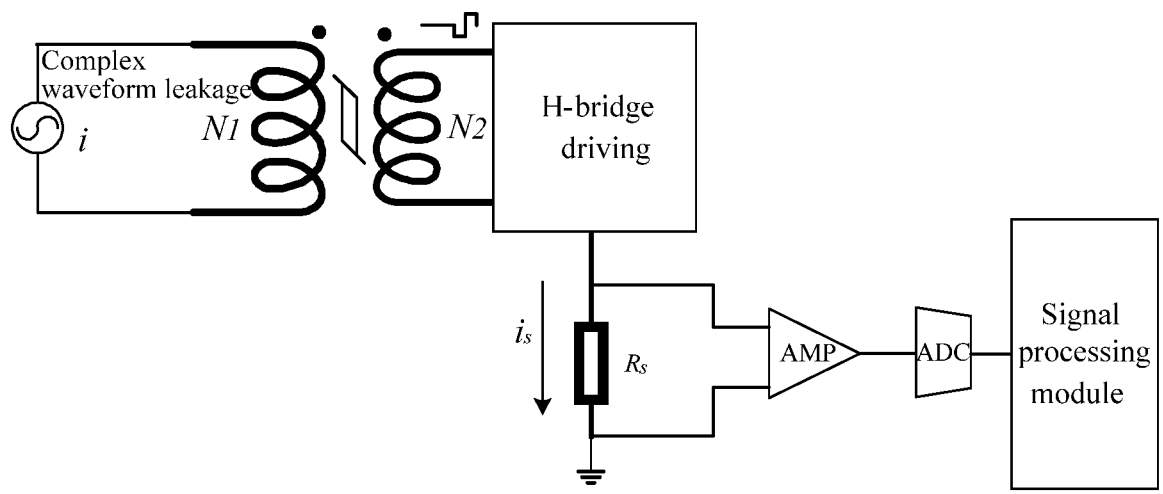
FIG. 2 is a diagram of a solution of an H-bridge driving circuit for detecting AC/DC current according to the present disclosure.

As shown in FIG. 2, a coil N1 represents a coil winding for excitation and detection, a coil N2 represents a winding for a leakage current. A current signal is acquired through a resistor Rs. During DC current detection, a magnetic core is excited by a bi-directional square wave through an H-bridge, and the magnetic core enters a saturation region in both directions to detect a DC current and a low-frequency AC current. During AC current detection, the H-bridge outputs at a low level. An AC leakage signal is detected in a pure induction mode. A signal on the sampling resistor Rs is amplified, the signal is converted into a digital signal through AD, results of the DC current detection and the AC current detection are processed to acquire a residual current.

Figure 3:
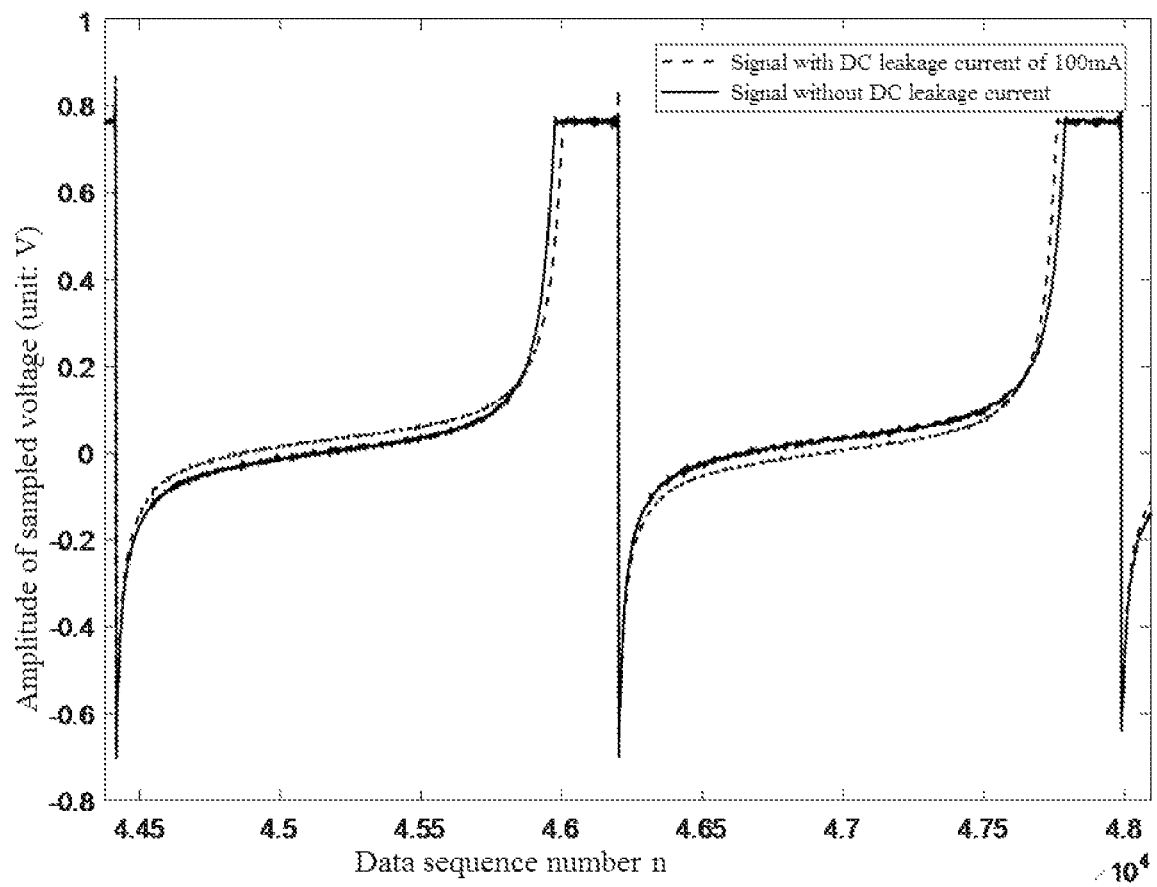
FIG. 3 is a schematic diagram showing synchronization using an excitation square wave according to the present disclosure.

When DC leakage occurs, change of the signal on the sampling resistor is shown in FIG. 3. A dotted line represents a waveform of a signal in a case that a DC leakage current is 100 mA, and a solid line represents a waveform of a signal without leakage current. It can be seen that the signal deviates up and down when current leaks. When a low-frequency leakage current is detected, an AC signal may be formed by superposing DC signals for different time periods.

According to the above phenomena and principles, a processing method in a DC leakage current detection channel according to the present disclosure includes the following steps.

Figure 4:
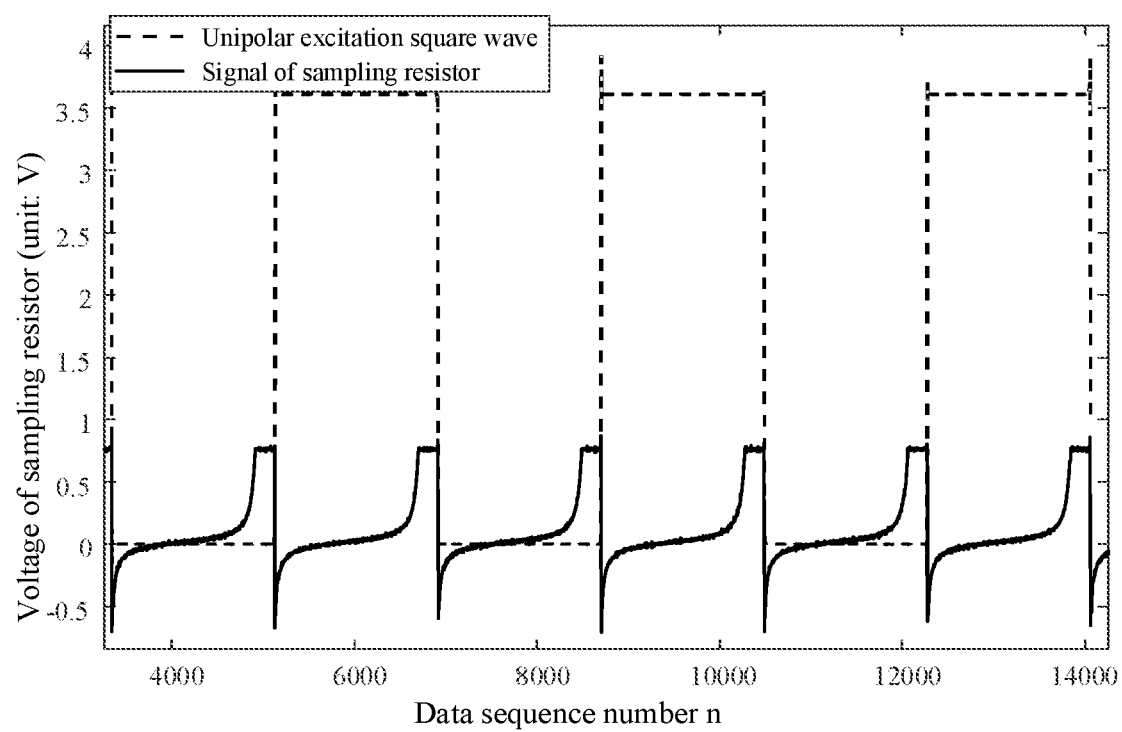
FIG. 4 is a diagram showing difference of a signal with DC leakage and a signal without DC leakage according to the present disclosure.

In step 1, an excitation square wave is used for signal synchronization. As shown in FIG. 4, a response signal when the magnetic core is positively excited is distinguished from a response signal when the magnetic core is negatively excited by using a rising edge and a falling edge of the excitation square wave. A horizontal axis represents a data sequence number after AD sampling, and a vertical axis represents a voltage of a resistor R.

Figure 5:
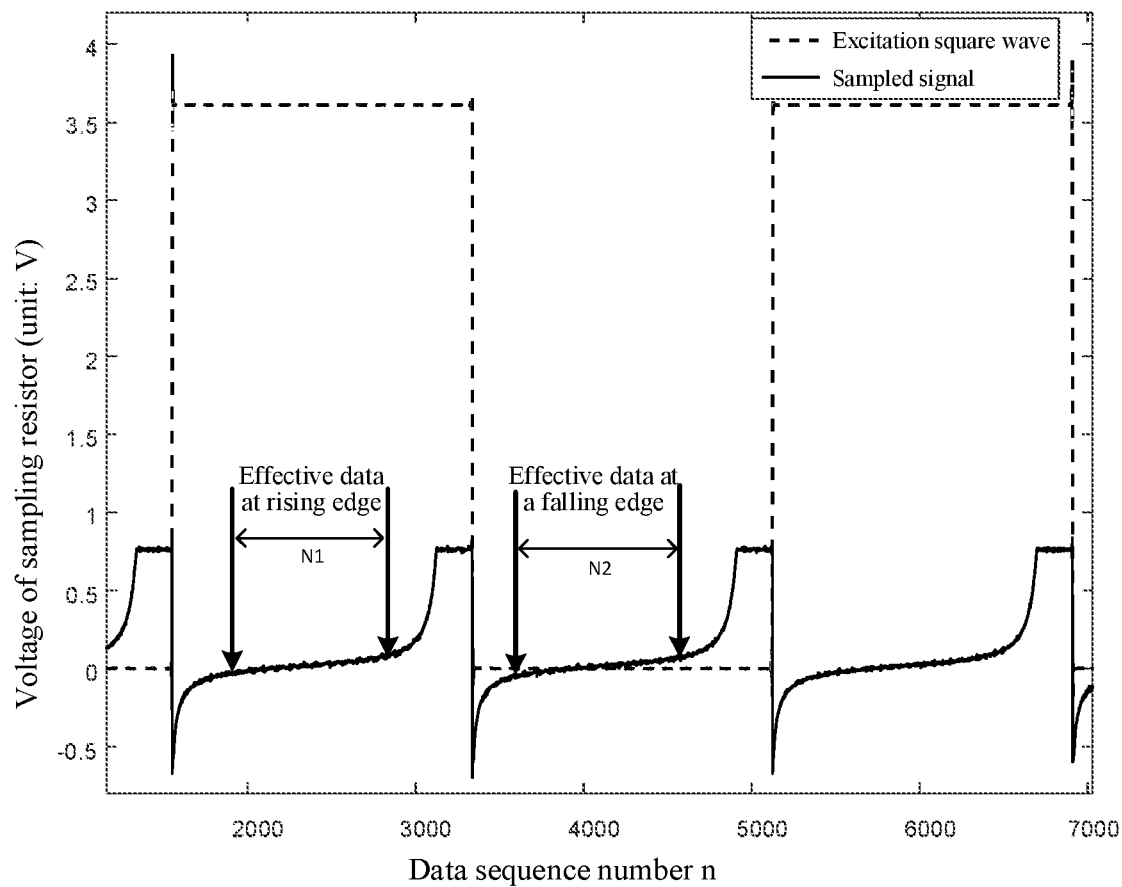
FIG. 5 is a schematic diagram showing extraction of effective data at a rising edge and effective data at a falling edge respectively in a DC detection channel according to the present disclosure.

In step 2, as shown in FIG. 5, effective data in a detection signal corresponding to a rising edge of the square wave and effective data in the detection signal corresponding to a falling edge of the square wave are extracted, where a flat area with slow change is an effective data area, a horizontal axis represents a data sequence number after AD sampling, and a vertical axis represents voltage amplitude.

In step 3, a mean of the effective data corresponding to the rising edge and a mean of the effective data corresponding to the falling edge are calculated.

It is assumed that the effective data corresponding to the rising edge extracted in step 2 is expressed by an equation: $x_p=[x_{p0}, x_{p1}, x_{p2}, \ldots, x_{p(N_1-1)}]$, and the effective data corresponding to the falling edge extracted in step 2 is expressed by an equation: $x_n=[x_{n0}, x_{n1}, x_{n2}, \ldots, x_{n(N_2-1)}]$. The mean of the effective data corresponding to the rising edge, and the mean of the effective data corresponding to the falling edge are respectively calculated by the following equations:

$$\begin{cases} \overline{x_p} = \frac{1}{N_1} \cdot \sum_{i=0}^{N_1-1} x_{pi} \\ \overline{x_n} = \frac{1}{N_2} \cdot \sum_{i=0}^{N_2-1} x_{ni} \end{cases}$$

After the above operation, two means are outputted for each excitation square wave period, which respectively are the mean $\overline{x_p}$ of the effective data corresponding to the rising edge and the mean $\overline{x_n}$ of the effective data corresponding to the falling edge.

In step 4, a demodulation value is equal to a difference between the mean corresponding to the rising edge and the mean corresponding to the falling edge by an equation: $y_i = \overline{x_p} - \overline{x_n}$, where $\overline{x_p}$ represents the mean of the effective data corresponding to the rising edge, and $\overline{x_n}$ represents the mean of the effective data corresponding to the falling edge.

In step 5, the demodulation value $y_i$ is compared with a preset threshold, and a comparison result is counted.

In a case that the demodulation value $y_i$ exceeds the threshold continuously by an amount, it is determined that a current suddenly increases, and windowing is performed directly at a current time instant, and data in the window is analyzed or tripped.

In step 6, windowing is performed on an output sequence.

The above demodulation point is a current corresponding to each square wave period. Windowing is performed on the demodulated sequence. It is assumed that Ts represents a time length of a window and f represents a frequency of the square wave, amount of data in the 20 ms window is expressed by an equation:

$$L = \lceil f_{square\ wave} \cdot T_s \rceil.$$

In step 7, an estimated DC current is calculated in the window.

It is assumed that a sequence of demodulation points in the window is expressed by an equation: $y=[y_0, y_1, \ldots, y_{L-1}]$. L represents a data length in the window. The DC current is acquired by averaging the sequence of demodulation points in the window by an equation:

$$\bar{y} = \frac{1}{L} \cdot \sum_{i=0}^{L-1} y_i.$$

In a case that N1 represents the number of turns of the winding coil and R represents resistance of the sampling resistor, an initial estimated DC current is expressed by an equation:

$$\tilde{y}_{DC} = \frac{\bar{y}}{R} \cdot N_1.$$

In step 8, an AC current at a frequency of 50 Hz in a DC detection mode is calculated.

In order to deal with the sudden increase of current, the amplitude is calculated only at the frequency of 50 Hz during the DC current detection, and the initial estimated current is corrected by an equation:

$$y_{50HZ} = \frac{1}{L} \cdot \left| \sum_{n=0}^{L-1} x(n) \cdot e^{-j\frac{2\pi n}{N}} \right|.$$

In step 9, the estimated AC/DC current is corrected.

Figure 6:
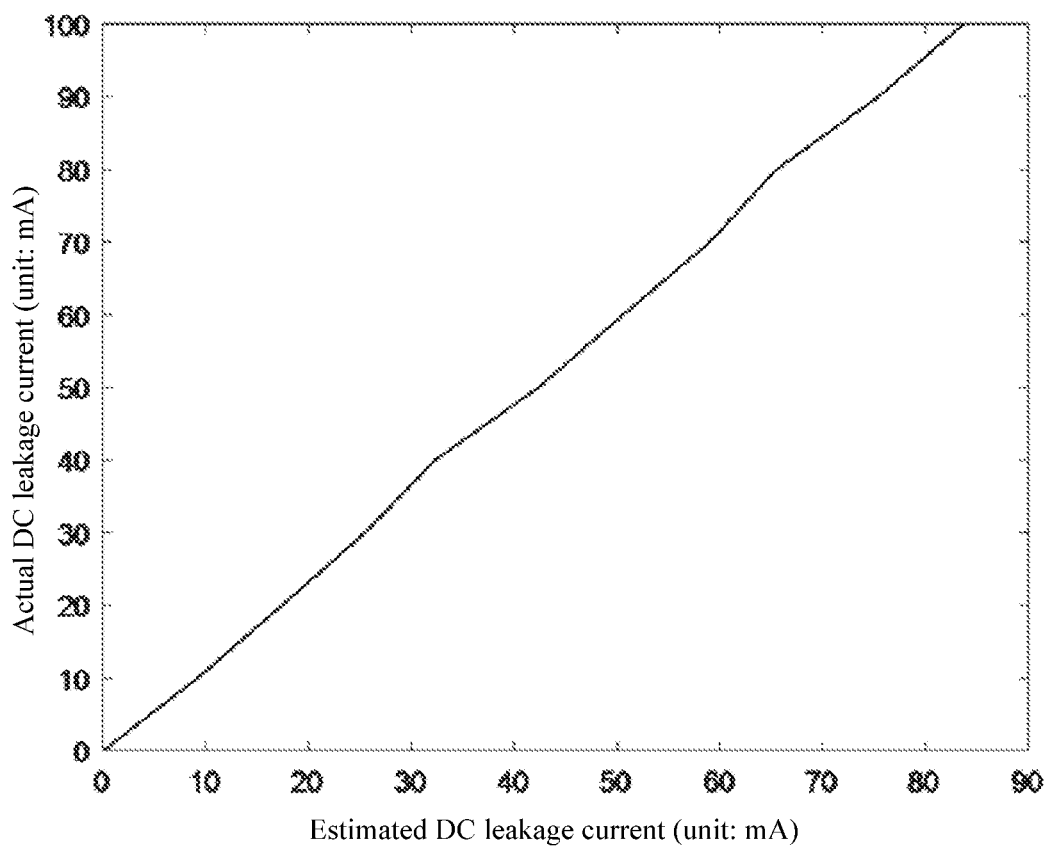
FIG. 6 is a diagram showing a relationship between an estimated DC leakage current and an actual DC leakage current according to the present disclosure.

The estimated AC and DC current in the steps 7 and 8 are linearly corrected to acquire an actual DC leakage current and an actual AC leakage current at the frequency of 50 Hz. FIG. 6 is a diagram showing a relationship between an estimated DC leakage current $\tilde{y}_{DC}$ and an actual DC leakage current. Therefore, the actual DC leakage current may be acquired by linear correction.

In a low-frequency AC detection channel, a processing flow of the channel includes the following steps.

In step 1, an AD sampled signal passes through a low-pass filter to filter out high-frequency component, severing as anti-aliasing filter of down sampling.

In step 2, in the embodiment, a sampling rate of the AD signal is 1 Msps, and down sampling is performed on the AD sampled signal.

In step 3, when the DC current or the AC current suddenly increases during the AC current detection, a voltage of the sampled signal is compared with a threshold Thr1 set by software. In a case that the voltage of the sampled signal is greater than the threshold Thr1, counting starts. In a case that a count is greater than a value for a time period, an interrupt signal is generated by hardware to a CPU, and a detection mode is controlled by software to change or is directly tripped.

In step 4, windowing is performed. The time length of the window is 20 ms, such as a Hamming window, a Hanning window or a rectangle window.

In step 5, FFT analysis is performed on data in the window, an absolute value of a result of the FFT analysis for each channel is calculated, and the calculated absolute value of each channel is divided by N, to acquire an amplitude of a leakage signal at each frequency point, where N represents the number of FFT points.

For an extracted channel, the following equation may be acquired:

$$y_h(k) = \frac{1}{N} \cdot \left| \sum_{n=0}^{N-1} x(n) \cdot e^{-j\frac{2\pi kn}{N}} \right|,$$

where $k \in \{0,1,2, \ldots, N-1\}$.

In step 6, a signal at the frequency of 50 Hz is corrected, and then the signal at each frequency point is corrected, to acquire the amplitude of the signal at each frequency point.

In a high-frequency detection channel, a processing flow of the channel includes the following steps.

In step 1, the sampled signal passes through a band-pass filter;

In step 2, windowing is performed. In order to multiplex low-frequency FFT, the length of the window is 2 ms to ensure that the number of data points in the window is consistent.

In step 3, FFT analysis is performed on data in the window, an absolute value of a result of the FFT analysis is calculated, to acquire an amplitude of a leakage signal at each frequency point.

For an extracted channel, the following equation may be acquired:

$$y_h(k) = \frac{1}{N} \cdot \left| \sum_{n=0}^{N-1} x(n) \cdot e^{-j\frac{2\pi kn}{N}} \right|,$$

where N represents the number of data points in the window, and $k \in \{0,1,2, \ldots, N-1\}$.

For the DC leakage current and AC leakage current calculated in the above detection modes, in a case that a current at each frequency point is greater than a threshold or an effective value is greater than a threshold, it may be determined that current leakage fault occurs.

The foregoing are merely preferred embodiments of the present disclosure. Those skilled in the art can make various modifications and variations to the present disclosure without departing from the principle of the present disclosure. Any modifications, equivalent substitutions and improvements made within the spirit and the principle of the present disclosure are within the protection scope of the present disclosure.

The invention claimed is:

1. A complex waveform signal processing method for AC and DC leakage detection, comprising:
   sensing, by a detection coil, a signal to be detected by adopting a circuit structure with multiplexing of an excitation coil and the detection coil;
   collecting a current signal on a sampling resistor Rs connected in series with a near-ground side of an H bridge; and
   during a DC detection mode, applying a bidirectional square wave excitation to a magnetic core through the H bridge, and measuring a DC current and a low-frequency AC current by entering a saturation region of the magnetic core bidirectionally;
   wherein functions of the DC leakage detection and the AC leakage detection are supported at the same time by using the time-sharing method;
   wherein in a positive and negative square wave excitation mode, the magnetic core enters a deep saturation region, and the DC current and the low-frequency AC current are detected;
   wherein in a pure induction mode in which the bidirectional square wave excitation is not applied to the magnetic core through the H bridge, and a low frequency AC current and a high frequency AC current are detected;
   wherein during the DC detection mode, processing of a detection signal comprises the following steps:

step 1: adopting an excitation square wave for synchronization, to distinguish effective data corresponding to a rising edge of the excitation square wave and effective data corresponding to a falling edge on a sampled signal;

step 2: extracting an effective data sequence corresponding to the rising edge and an effective data sequence corresponding to the falling edge on the sampling resistor after synchronization and alignment respectively;

step 3: calculating a mean of the extracted effective data sequence corresponding to the rising edge and a mean of the extracted effective data sequence corresponding to the falling edge respectively;

step 4: subtracting the mean of the effective data sequence corresponding to the rising edge and the mean of the effective data corresponding to the falling edge, and performing demodulation:

$$y_i = \overline{x_p} - \overline{x_n},$$

wherein $\overline{x_p}$ and $\overline{x_n}$ represent the mean of the effective data sequence corresponding to the rising edge and the mean of the effective data sequence corresponding to the falling edge in step 3 respectively;

step 5: comparing a demodulation value $Y_i$ with a threshold, and counting a comparison result;

step 6: windowing at a current position in a case that a count value is greater than a preset value for a time period;

step 7: estimating the DC current in the window, comprising:

assuming that a sequence of demodulation points in the window is expressed by an equation: $y=[y_0, y_1, \ldots, y_{L-1}]$, wherein L represents a data length in the window;

obtaining the DC current by averaging the sequence of the demodulation points in the window by an equation:

$$\bar{y} = \frac{1}{L} \cdot \sum_{i=0}^{L-1} y_i;$$

and expressing, in a case that N1 represents the number of turns of the detection coil and R represents resistance of the sampling resistor, an initial estimated DC current by an equation:

$$\bar{y}_{DC} = \frac{\bar{y}}{R} \cdot N_1;$$

step 8: calculating an AC current at a frequency of 50Hz in DC detection mode by an equation:

$$y_{50HZ} = \frac{1}{L} \cdot \left| \sum_{n=0}^{L-1} x(n) \cdot e^{-j\frac{2\pi n}{N}} \right|;$$

wherein L represents the data length in the window, and $y_i$ represents the sequence of the demodulation points in the window; and step 9: correcting the estimated DC current and AC current at the frequency of 50Hz;

wherein in a low frequency AC detection mode, the low frequency AC detection mode is switched to the DC detection mode in a case that a current change exceeds a preset threshold within a preset time is detected;

wherein in the DC detection mode, a windowing operation is performed at the current moment in a case that the current change exceeds the preset threshold within the preset time is detected; and wherein a tripping operation is performed in a case that the demodulation value exceeds a detection threshold.

2. The complex waveform signal processing method according to claim 1, wherein an H-bridge driving module outputs a three-state voltage of positive excitation, negative excitation and zero excitation by adopting a circuit structure with multiplexing of an excitation coil and a detection coil;

wherein in a case that a positive level and a negative level are outputted, bidirectional excitation is applied to the magnetic core to make the magnetic core enter the saturation region, and the DC current and the low-frequency AC current are detected; and wherein in a case that a low level is outputted, an AC current is detected in the pure induction mode.

3. The complex waveform signal processing method according to claim 1, comprising:

performing time-sharing detection on the DC current and the AC current to support both DC leakage detection and AC leakage detection;

wherein the low-frequency AC current is detected during DC current detection, and only an AC leakage current and a DC leakage current are detected in the AC detection mode.

4. The complex waveform signal processing method according to claim 1, wherein the method comprises:

controlling a detection mode to switch immediately by detecting the current change within the preset time, comprising:

in the AC detection mode, switching the detection mode in a case that an AC current change or a DC current change exceeds the preset threshold within the preset time, if it is detected that an amplitude of the current detected within a period of time continuously exceeds a threshold for a number of times; and in the DC detection mode, windowing at the current time in a case that it is detected that the amplitude of the current detected continuously exceeds the threshold for a number of times.

5. The complex waveform signal processing method according to claim 1, wherein in the DC detection mode, the step 3 and step 8 further comprise:

step 3: calculating the mean of the extracted effective data sequence corresponding to the rising edge and the mean of the extracted effective data sequence corresponding to the falling edge respectively, by the following equations:

$$\begin{cases} \overline{x_p} = \frac{1}{N_1} \cdot \sum_{i=0}^{N_1-1} x_{pi} \\ \overline{x_n} = \frac{1}{N_2} \cdot \sum_{i=0}^{N_2-1} x_{ni} \end{cases},$$

wherein an effective data sequence corresponding to the rising edge is $x_p=[x_{p0}, x_{p1}, x_{p2}, \ldots, x_{p(N_1-1)}]$, and an effective data corresponding to the falling edge is $x_n=[x_{n0}, x_{n1}, x_{n2}, \ldots, x_{n(N_2-1)}]$; and step 8: calculating the AC current at the frequency of 50Hz in the DC detection mode by an equation:

$$y_{50\,HZ} = \frac{1}{L} \cdot \left| \sum_{n=0}^{L-1} x(n) \cdot e^{-j\frac{2\pi n}{N}} \right|;$$

wherein L represents the data length in the window, and $y_i$ represents the sequence of the demodulation points in the window.

6. The complex waveform signal processing method according to claim 1, wherein
in the low-frequency AC detection mode, a processing method for a detection signal comprises the following steps:
step 1: collecting, by an AD sampled signal, a current signal on the sampling resistor Rs through a low-pass filter;
step 2: performing down sampling on the AD sampled signal, to reduce a sampling rate of a low-frequency signal;
step 3: comparing a value of the sampled signal with a threshold Thr1; counting a comparison result; switching, in a case that a count is greater than a preset value, the low-frequency AC detection mode to the DC detection mode; and analyzing, in a case that a count is less than or equal to the preset value, in the AC detection mode;
step 4: windowing in a case of analyzing in the AC detection mode;
step 5: performing FFT analysis on data in the window, dividing an absolute value of a result of the FFT analysis by N, where N represents the number of FFT points; and
step 6: correcting an amplitude of a signal at each frequency point to obtain a leakage current value of each low frequency point.

7. The complex waveform signal processing method according to claim 1, wherein
in the high-frequency AC detection mode, a processing method for a detection signal comprises the following steps:
passing by an AD sampled signal through a band-pass filter;
windowing;
performing FFT analysis on data in the window; and
calculating an absolute value of an FFT result to obtain a leakage current value of each high frequency point.

8. The complex waveform signal processing method according to claim 1, further comprising:
calculating an overall leakage current by synthesizing the DC current, the current at each low-frequency point and the current at each high-frequency point; and
determining whether to perform a tripping operation according to the DC current, the current at each low-frequency point, the current at each high-frequency point and the overall leakage current.

* * * * *